(12) United States Patent
Nakanishi et al.

(10) Patent No.: US 6,188,285 B1
(45) Date of Patent: Feb. 13, 2001

(54) PHASE-LOCKED LOOP CIRCUIT AND VOLTAGE-CONTROLLED OSCILLATOR CAPABLE OF PRODUCING OSCILLATIONS IN A PLURALITY OF FREQUENCY RANGES

(75) Inventors: Jingo Nakanishi; Yasunobu Nakase, both of Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/281,904

(22) Filed: Mar. 31, 1999

(30) Foreign Application Priority Data

Oct. 23, 1998 (JP) .................................................. 10-302157

(51) Int. Cl.[7] .............................. H03B 5/02; H03L 7/099
(52) U.S. Cl. .................................. 331/2; 331/25; 331/34; 331/57; 331/177 R; 331/179
(58) Field of Search ..................................... 331/2, 34, 25, 331/57, 177 R, 179

(56) References Cited

U.S. PATENT DOCUMENTS

| | | | |
|---|---|---|---|
| 5,136,260 | * | 8/1992 | Yousefi-Elezei ........................ 331/17 |
| 5,389,898 | * | 2/1995 | Taketoshi et al. ........................ 331/2 |
| 5,686,864 | * | 11/1997 | Martin et al. ........................ 331/1 A |
| 5,712,601 | * | 1/1998 | Shimada et al. ................. 331/177 R |

FOREIGN PATENT DOCUMENTS 63-123226  5/1988  (JP).
2-272912  11/1990  (JP).

OTHER PUBLICATIONS

"MOS Oscillators with Multi–Decade Tuning Range and Gigahertz Maximum Speed", by Mihai Banu, IEEE Journal of Solid–State Circuits, vol. SC–23, pp. 474–479, Apr. 1988.
"Design of PLL–Based Clock Generation Circuits", By Jeong et al., IEEE Journal of Solid–State Circuits, vol. SC–22, No. 2, Apr. 1987, pp. 255–261.

* cited by examiner

*Primary Examiner*—Siegfried H. Grimm
(74) *Attorney, Agent, or Firm*—McDermott, Will & Emery

(57) ABSTRACT

In a PLL circuit including a plurality of VCOs, first and second switches are respectively connected between the gate and source and the gate and drain of a P channel MOS transistor included in a current mirror circuit of each VCO. In a VCO which is employed, only the second switch is turned on to allow a control current to flow. In a VCO which is not employed, only the first switch is turned on to cut off the control current. Compared with a conventional circuit in which all of the plurality of VCOs are always producing oscillations, the power consumption is reduced.

17 Claims, 9 Drawing Sheets

PHASE-LOCKED LOOP CIRCUIT AND VOLTAGE-CONTROLLED OSCILLATOR CAPABLE OF PRODUCING OSCILLATIONS IN A PLURALITY OF FREQUENCY RANGES

BACKGROUND OF THE INVENTION

1. Field of the Invention

The present invention relates to phase-locked loop circuits and voltage-controlled oscillators. The invention particularly relates to a phase-locked loop circuit which generates a clock signal in synchronization with a reference clock signal, and to a voltage-controlled oscillator which produces oscillations at a frequency according to a control voltage in a frequency range selected from a plurality of frequency ranges of oscillations that can be generated by the oscillator.

2. Description of the Background Art

The phase-locked loop (PLL) circuit has a function of producing oscillations by itself to generate a clock signal, and synchronizing the phase of the clock signal with that of an externally supplied reference clock signal. A clock signal having multiples of the frequency of a reference clock signal can be generated by providing a frequency divider in the loop of the PLL circuit. The PLL circuit is thus utilized as the means for supplying a clock signal stably into a chip or supplying a high-speed clock signal at multiples of the frequency of an input clock signal.

FIG. 8 is a circuit block diagram illustrating a structure of a conventional PLL circuit. Such a PLL circuit is disclosed in, for example, "Design of PLL-Based Clock Generation Circuits" (IEEE JOURNAL OF SOLID-STATE CIRCUITS VOL. SC-22, NO. 2, APRIL, 1987) by DEOG-KYOON JEONG et al.

Referring to FIG. 8, the PLL circuit includes a phase/frequency detector (PFD)+phase difference-current converter (Charge Pump: CP) 101, a loop filter (LPF) 102, and a voltage-controlled oscillator (VCO) 105.

PFD+CP 101 detects the phase difference between an externally supplied reference clock signal CLK and a feedback clock signal CLK', and current according to the phase difference is supplied to LPF 102. LPF 102 includes a resistance element 103 and a capacitor 104, and integrates the current supplied from PFD+CP 101 to generate a control voltage VL. VCO 105 produces oscillations at a frequency according to control voltage VL generated by LPF 102 and supplies clock signal CLK'. Clock signal CLK' from VCO 105 is supplied into a chip via a clock drive and fed back to PFD+CP 101. Clock signal CLK' is thus synchronized with reference clock signal CLK.

The power consumption of a chip has been increasing recently as the operating frequency becomes higher. Any way for operating an internal circuit at a low speed unless a high-speed operation is required would be effective, in order to reduce the power consumption. There are three methods of implementing such a way that will be set forth below.

According to the first method, a plurality of PLL circuits having different lock ranges are provided in a chip. For a high-speed operation, a clock signal with a higher frequency is supplied into the chip via a PLL circuit having a lock range with higher frequencies. For a low-speed operation, a clock signal with a lower frequency is supplied into the chip via a PLL circuit having a lock range with lower frequencies. The lock range refers to a frequency range with which the PLL circuit can be synchronized. The value of the lock range is determined by the frequency range of oscillations that can be produced by the VCO in the PLL circuit.

A problem of the first method is the increase in the layout area resulting in increase in power consumption due to the plurality of PLL circuits provided in the chip including capacitor 104 in LPF 102 that generally has a capacitance of as much as several hundreds pf According to the second method, a PLL circuit having a wide lock range from a lower frequency to a higher frequency is provided in a chip. For a high-speed operation, a clock signal with a higher frequency is supplied into the chip, and a clock signal with a lower frequency is supplied into the chip for a low-speed operation.

The second method requires that a frequency range of oscillations that can be produced by VCO 105 should be sufficiently wide. In order to increase the frequency range of oscillations that can be generated by VCO 105, gain of VCO 105 (the ratio of increase in oscillation frequency to increase in control voltage VL) should be increased and accordingly the sensitivity of VCO 105 should be enhanced. Generally VCO 105 with high sensitivity is difficult to implement. Further, if the sensitivity of VCO 105 is enhanced, response to a slight change in control voltage VL is accordingly enhanced to increase the influence of noises.

According to the third method, as shown in FIG. 9, a plurality of (two in the figure) VCOs 105 and 106 are provided in a single PLL circuit. VCOs 105 and 106 have different frequency ranges of oscillations that can be produced, and thus generate oscillations at frequencies different from each other in response to control voltage VL. A selector 107 selects one of clock signals CLK1 and CLK2 supplied from VCOs 105 and 106 according to the operation speed of the circuit, supplies the selected clock signal into the chip and the selected clock signal is also fed back to PFD+CP 101.

According to the third method, the layout area and power consumption are smaller compared with the first method according to which a plurality of PLL circuits are provided in the chip. In addition, stability is improved compared with the second method by making the gain of VCOs 105 and 106 equal to each other while there is the difference in the frequency range of oscillations that can be produced between VCO 105 and VCO 106.

However, all of the VCOs 105 and 106 in the PLL circuit in FIG. 9 are always producing oscillations, and unnecessary power is consumed by the VCO supplying a clock signal which is not used.

SUMMARY OF THE INVENTION

One object of the present invention is to provide a phase-locked loop circuit and a voltage-controlled oscillator having a plurality of frequency ranges of oscillations that can be produced and a small power consumption.

According to one aspect of the present invention, a phase-locked loop circuit includes a control circuit that activates only a selected voltage-controlled oscillator and inactivates other voltage-controlled oscillators based on the frequency of a reference clock signal. Consequently, the power consumption is reduced compared with the conventional circuit where all voltage-controlled oscillators produce oscillations.

Preferably, a voltage-controlled oscillator includes a current-controlled oscillator, a first transistor allowing current to flow according to a control voltage, and a current mirror circuit supplying current to the current-controlled oscillator as a control current according to the current flowing through the first transistor. The control circuit allows the current mirror circuit to stop its current transmitting function to inactivate the voltage-controlled oscillator, and allows the current mirror circuit to perform its current transmitting function to activate the voltage-controlled oscillator. As a result, the voltage-controlled oscillator can be activated and inactivated easily.

Still preferably, the current mirror circuit includes a second transistor having a first electrode connected to a line of the power supply potential, a second electrode connected to a first electrode of the first transistor, and an input electrode connected to the current-controlled oscillator, a first switching element connected between the input electrode of the second transistor and the line of the power supply potential, and a second switching element connected between the input electrode and the second electrode of the second transistor. The control circuit renders the first switching element conductive to allow the current mirror circuit to stop the current transmitting function, and renders the second switching element conductive to allow the current mirror circuit to perform the current transmitting function. In this case, the current transmitting function of the current mirror circuit can be controlled easily.

According to another aspect of the present invention, a voltage-controlled oscillator includes a current-controlled oscillator, a first variable-resistance circuit with its resistance value adjusted according to a selected frequency range of oscillations that can be produced, a transistor connected in series with the first variable-resistance circuit to allow current to flow according to a control voltage, and a current mirror circuit supplying current to the current-controlled oscillator as a control current according to the current flowing through the transistor. One voltage-controlled oscillator can thus have a plurality of frequency ranges of oscillations that can be produced. Therefore, reduction of the layout area and power consumption is achieved while the conventional circuit requires a plurality of voltage-controlled oscillators in order to obtain a plurality of frequency ranges of oscillations that can be produced.

Preferably, a second variable-resistance circuit is provided connected in parallel with the first variable-resistance circuit and the transistor and having its resistance value adjusted according to a selected frequency range of oscillations that can be produced. The current mirror circuit supplies the sum of the current flowing through the transistor and the current flowing through the second variable-resistance circuit to the current-controlled oscillator. In this case, for a plurality of frequency ranges of oscillations that can be produced, the same VCO gain is obtained. As a result, the optimum relation between stability and quick response capability is ensured for each frequency range of oscillations that can be generated.

Still preferably, the first variable-resistance circuit includes a plurality of first resistance elements and a first switching circuit connecting, one of the plurality of the first resistance elements that has a resistance value according to a selected frequency range of oscillations which can be generated, in series with the transistor, and the second variable-resistance circuit includes a plurality of second resistance elements and a second switching circuit connecting, one of the plurality of the second resistance elements that has a resistance value according to a selected frequency range of oscillations which can be produced, in parallel with the first resistance element and the transistor connected in series by the first switching circuit. The first and second variable-resistance circuits can thus be readily formed.

Still preferably, the first variable-resistance circuit includes a plurality of first resistance elements connected in series, and a first switching element provided corresponding to each of the first resistance elements to be connected in parallel with the corresponding first resistance element, and rendered conductive or non-conductive according to a selected frequency range of oscillations that can be produced. The second variable-resistance circuit includes a plurality of second resistance elements connected in series, and a second switching element provided corresponding to each of the second resistance elements to be connected in parallel with the corresponding second resistance element, and rendered conductive or non-conductive according to a selected frequency range of oscillations that can be produced. In this case, the first and second valiable-resistance circuits can be formed easily and the layout area can be reduced.

A voltage-controlled oscillator of a phase-locked loop circuit according to still another aspect of the present invention includes a current-controlled oscillator, a first variable-resistance circuit having its resistance value adjusted to the one according to a frequency range selected from a plurality of frequency ranges of oscillations that can be produced, a transistor connected in series with the first variable-resistance circuit and allowing current to flow according to a control voltage, and a current mirror circuit supplying current as a control current to the current-controlled oscillator according to the current flowing through the transistor. One voltage-controlled oscillator can thus have a plurality of frequency ranges of oscillations that can be produced. As a result, the layout area and power consumption can be reduced while the conventional circuit requires a plurality of voltage-controlled oscillators in order to obtain a plurality of frequency ranges of oscillations that can be produced.

Preferably, the voltage-controlled oscillator further includes a second variable-resistance circuit connected in parallel with the first variable-resistance circuit and the transistor and having its resistance value adjusted to the one according to a selected frequency range of oscillations that can be produced. In this case, for the plurality of frequency ranges of oscillations that can be produced, the same VCO gain is obtained. Accordingly, the optimum relation between stability and quick response capability is ensured for each frequency range of oscillations that can be produced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
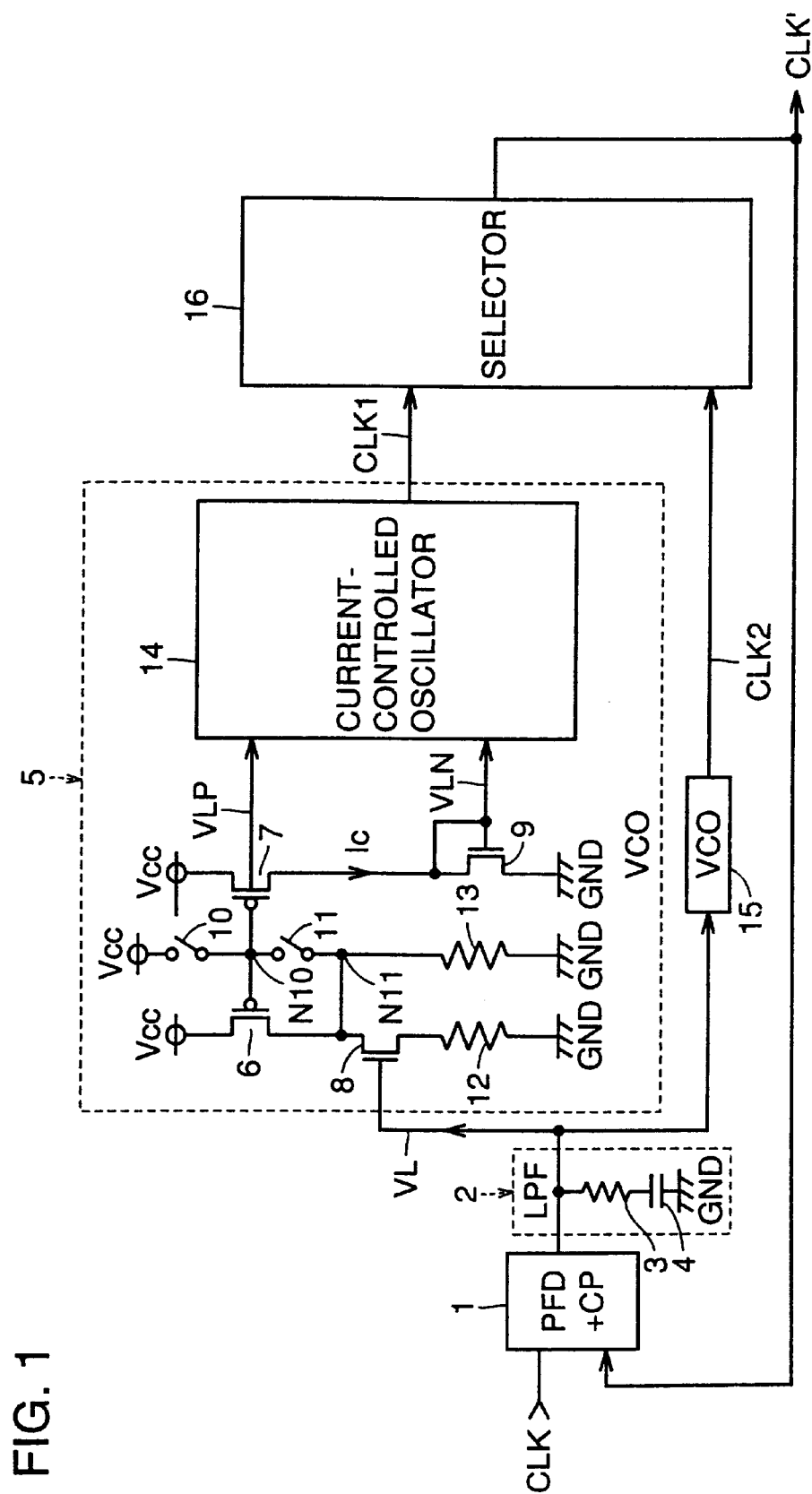
FIG. 1 is a circuit block diagram illustrating a structure of a PLL circuit according to the first embodiment of the present invention.

FIG. 1 is a circuit block diagram illustrating a structure of a PLL circuit according to the first embodiment of the present invention. Referring to FIG. 1, the PLL circuit includes a PFD+CP 1, an LPF 2, VCOs 5 and 15 and a selector 16.

PFD+CP 1 compares a phase of an externally supplied reference clock signal CLK with that of a feedback clock signal CLK' to detect a difference in phase, and supplies current to LPF 2 according to the phase difference. LPF 2 includes a resistance element 3 and a capacitor 4, and integrates the current supplied from PFD+CP 1 to generate a control voltage VL.

VCO 5 includes P channel MOS transistors 6 and 7, N channel MOS transistors 8 and 9, switches 10 and 11, resistance elements 12 and 13, and a current-controlled oscillator 14. P channel MOS transistor 6, N channel MOS transistor 8 and resistance element 12, switches 10, 11 and resistance element 13, and P channel MOS transistor 7 and N channel MOS transistor 9 are connected in series between a line of power supply potential Vcc and a line of ground potential GND.

P channel MOS transistors 6 and 7 have the gates both connected to a node N10 between switches 10 and 11. P channel MOS transistor 6 has the drain connected to a node N11 between switch 10 and resistance element 13. The gate of N channel MOS transistor 8 receives control voltage VL generated by LPF 2. The gate of N channel MOS transistor 9 is connected its drain. A potential VLP on the gates of P channel MOS transistors 6 and 7 (node N10) and a potential VLN on the gate of N channel MOS transistor 9 are supplied to current-controlled oscillator 14. Current-controlled oscillator 14 produces oscillations at a frequency according to control potentials VLP and VLN, that is, a control current Ic flowing through MOS transistors 7 and 9.

Figure 2:
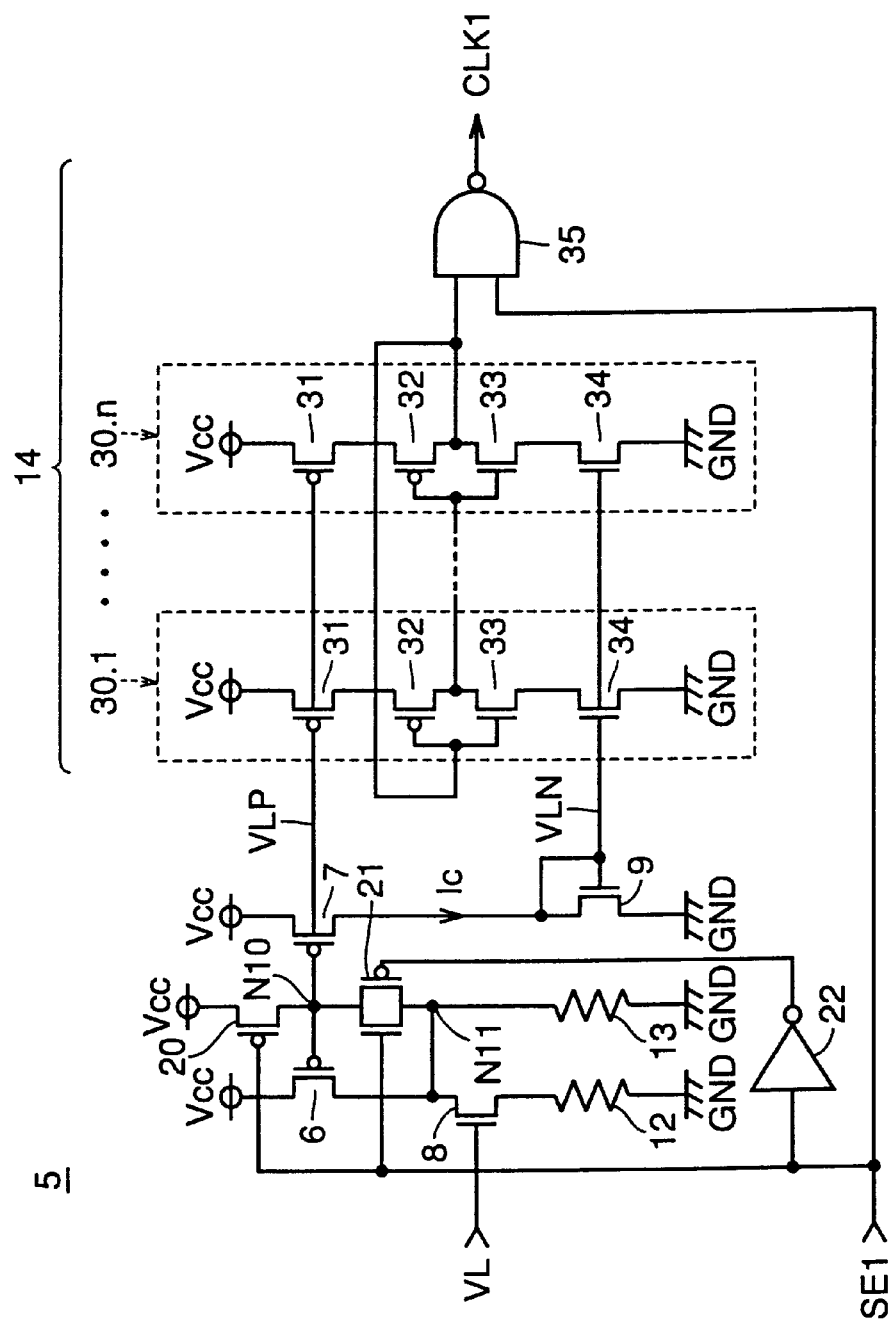
FIG. 2 is a circuit diagram illustrating a structure of a VCO of the PLL circuit shown in FIG. 1.

A specific structure of VCO 5 is illustrated in FIG. 2. Switch 10 is formed of a P channel MOS transistor 20 connected between the line of power supply potential Vcc and node N10 and having its gate receiving a selection signal SE1. Switch 11 is formed of a transfer gate 21 and an inverter 22. Transfer gate 21 is connected between nodes N10 and N11. Selection signal SE 1 is supplied to the gate of a P channel MOS transistor of transfer gate 21 via inverter 22, and directly supplied to the gate of an N channel MOS transistor of the transfer gate 21. When selection signal SE1 has a logic low or "L" level, P channel MOS transistor 20 is conductive and transfer gate 21 is non-conductive. When selection signal SE1 has a logic high or "H" level, transfer gate 21 is conductive and P channel MOS transistor 20 is non-conductive.

Current-controlled oscillator 14 includes n stages (n is an odd number) of current-controlled delay circuits 30.1–30.n and an NAND gate 35. Each of current-controlled delay circuits 30.1–30.n includes P channel MOS transistors 31 and 32 as well as N channel MOS transistors 33 and 34 connected in series between the line of power supply potential Vcc and the line of ground potential GND. The gates of P channel MOS transistor 31 and N channel MOS transistor 34 are respectively connected to the gates of P channel MOS transistor 7 and N channel MOS transistor 9. The gates of MOS transistors 32 and 33 are commonly connected to form an input node of the delay circuit. A node between MOS transistors 32 and 33 forms an output node of the delay circuit.

Delay circuits 30.1–30.n are connected in a loop form. Specifically, outputs of delay circuits 30.1–30.n-1 are respectively supplied to delay circuits 30.2–30.n at respective subsequent stages. An output of delay circuit 30.n at the last stage is supplied to delay circuit 30.1 at the first stage. NAND gate 35 receives a signal from delay circuit 30.n at the last stage and signal SE1. A signal from NAND gate 35 is an output signal CLK1 of VCO 5.

VCO 15 is identical to VCO 5 except that an inverse signal/SE1 of selection signal SE1 is supplied instead of selection signal SE1 and that they have different frequency ranges of oscillations that can be produced. The frequency range of oscillations that can be produced by VCO 5 is determined by the size of transistors 6–9, the resistance values of resistance elements 12 and 13, the number of stages of delay circuits 30.1–30.n, and so on. A frequency range of oscillations of VCO 15 is here assumed to be on the lower frequency side compared with that of VCO 5.

Selector 16 selects one of clock signals CLK1 and CLK2 from VCOs 5 and 15 to supply the selected clock signal into the chip and feed it back to PFD+CP 1.

Description of an operation of the PLL circuit is next given. If the frequency of reference clock signal CLK is high and accordingly VCO 5 is used, selection signal SE1 attains H level to render P channel MOS transistor 20 (switch 10) non-conductive and render transfer gate 21 (switch 11) conductive, so that P channel MOS transistors 6 and 7 constitute a current mirror circuit.

According to control voltage VL, current flows through N channel MOS transistor 8. The sum of the current flowing through N channel MOS transistor 8 and resistance element 12 and current flowing through resistance element 13 flows through P channel MOS transistor 6. The same amount of current flows through P channel MOS transistors 6 and 7 if the P channel MOS transistors 6 and 7 have the same size since P channel MOS transistors 6 and 7 form the current mirror circuit. In addition, the same amount of current Ic flows through P channel MOS transistor 7 and N channel MOS transistor 9 since P channel MOS transistor 7 and N channel MOS transistor 9 are connected in series.

The gates of P channel MOS transistors 31 and 7 are commonly connected and the gates of N channel MOS transistors 34 and 9 are also commonly connected. Therefore, current corresponding to current Ic flows through MOS transistors 31 and 34. If the current flowing through MOS transistors 31 and 34 increases, signal transmission speed of each of delay circuits 30.1–30.n becomes higher to increase an oscillation frequency. On the other hand, if the current flowing through MOS transistors 31 and 34 decreases, the signal transmission speed of each of delay circuits 30.1–30.n becomes lower to reduce the oscillation frequency.

H level of selection signal SE1 permits a clock signal from delay circuit 30.n of the last stage to pass through NAND gate 35. Selector 16 feeds clock signal CLK1 from VCO 5 back to PFD+CP 1 as feedback clock signal CLK'.

If the frequency of reference clock signal CLK is lower than that of feed back clock signal CLK', positive charges are supplied from PFD+CP 1 to LPF 2 to gradually increase control voltage VL. Increase of control voltage VL increases control current Ic, leading to an increased oscillation frequency. On the contrary, if the frequency of reference clock signal CLK is higher than the frequency of feed back clock signal CLK', negative charges are supplied from PFD+CP 1 to LPF 2 to gradually decrease control voltage VL. The decrease of control voltage VL decreases control current Ic, leading to a lower oscillation frequency. Consequently, clock signals CLK and CLK' are made equal in frequency and phase. At this time, oscillation of VCO 15 is stopped.

If the frequency of reference clock signal CLK is low and clock signal CLK1 from VCO 5 is not to be used, selection signal SE1 attains L level to render P channel MOS transistor 20 (switch 10) conductive and render transfer gate 21 (switch 11) non-conductive. Node N11 thus attains H level to render P channel MOS transistors 6, 7 and 31 non-conductive. Accordingly, delay circuits 30.1–30.n receive no driving current and oscillation is stopped. An output of NAND gate 35 is fixed at H level.

On the other hand, VCO 15 produces oscillations and supplies a clock signal CLK2. Selector 16 feeds clock signal CLK2 from VCO 15 back to PFD+CP 1 as feedback clock signal CLK'. Accordingly, clock signals CLK and CLK' become equal in frequency and phase.

According to this embodiment, one of the two VCOs 5 and 15 that is not used is stopped from producing oscillations. Therefore, power consumption is reduced compared with the conventional circuit requiring that both of the two VCOs 105 and 106 always produce oscillations whether they are used or not.

Second Embodiment

Figure 3:
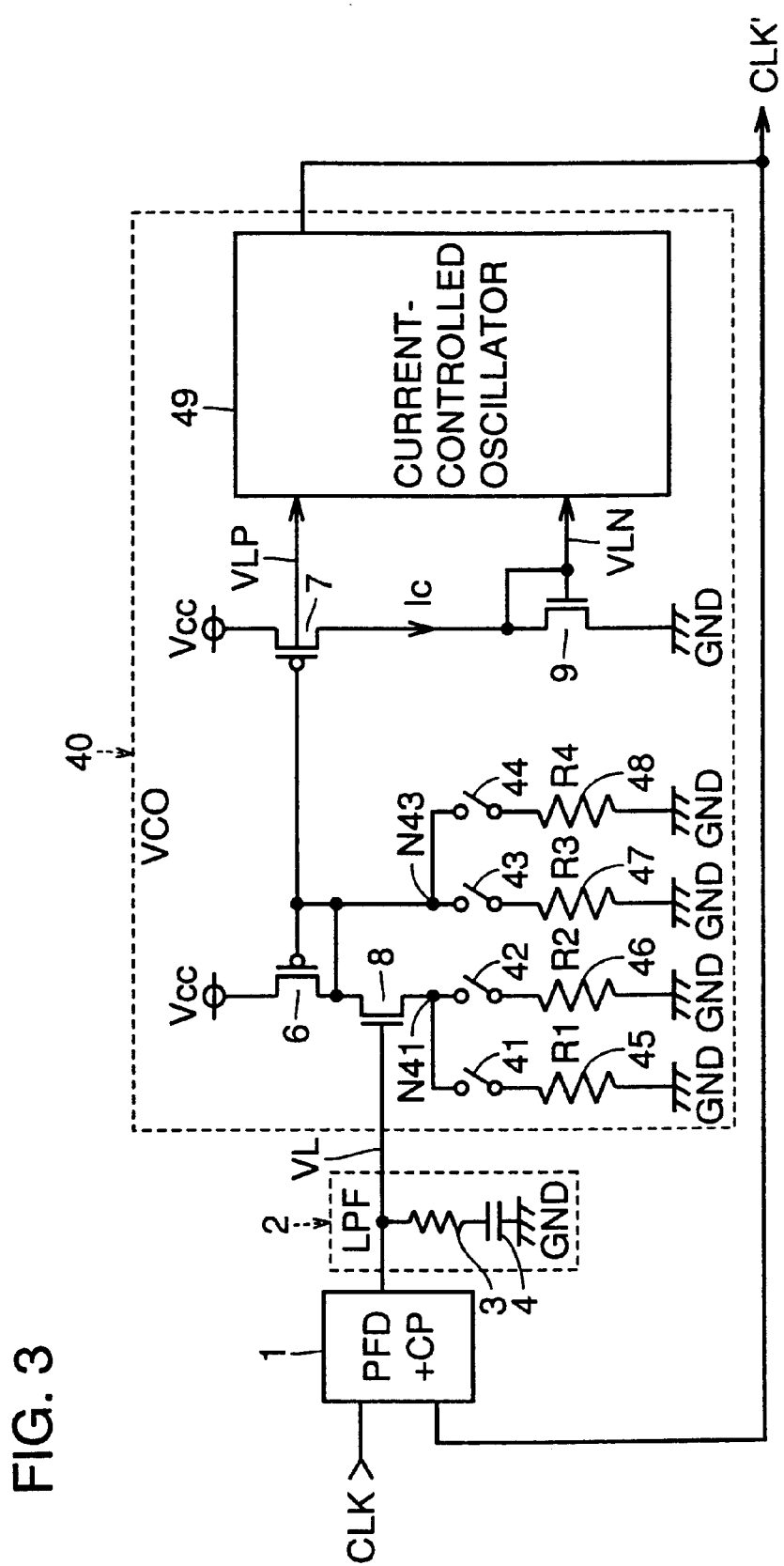
FIG. 3 is a circuit block diagram illustrating a structure of a PLL circuit according to the second embodiment of the present invention.

FIG. 3 is a circuit block diagram illustrating a structure of a PLL circuit according to the second embodiment of the present invention. Referring to FIG. 3, the PLL circuit includes a PFD+CP 1, an LPF 2 and a VCO 40. PFD+CP 1 and LPF 2 correspond to those of the PLL circuit shown in FIG. 1.

VCO 40 includes P channel MOS transistors 6 and 7, N channel MOS transistors 8 and 9, switches 41–44, resistance elements 45–48, and a current-controlled oscillator 49. MOS transistors 6 and 8, switch 41 and resistance element 45, and MOS transistors 7 and 9 are connected in series respectively between a line of power supply potential Vcc and a line of ground potential GND. Switch 42 and resistance element 46 are connected in series between the source of N channel MOS transistor 8 (node N41) and the line of ground potential GND. The gate and drain of P channel MOS transistor 6 and the gate of P channel MOS transistor 7 are commonly connected to a node N43. P channel MOS transistors 6 and 7 constitute a current mirror circuit. N channel MOS transistor 8 allows current to flow according to control voltage VL.

Switch 43 and resistance element 47, and switch 44 and resistance element 48 are respectively connected in series between node N43 and the line of ground potential GND. N channel MOS transistor 9 has its gate connected to its drain. Gate potentials VLP and VLN of MOS transistors 7 and 9 are supplied to current-controlled oscillator 49. Current-controlled oscillator 49 produces oscillations at a frequency according to control voltages VLP and VLN, that is, control current Ic flowing through MOS transistors 7 and 9.

Figure 4:
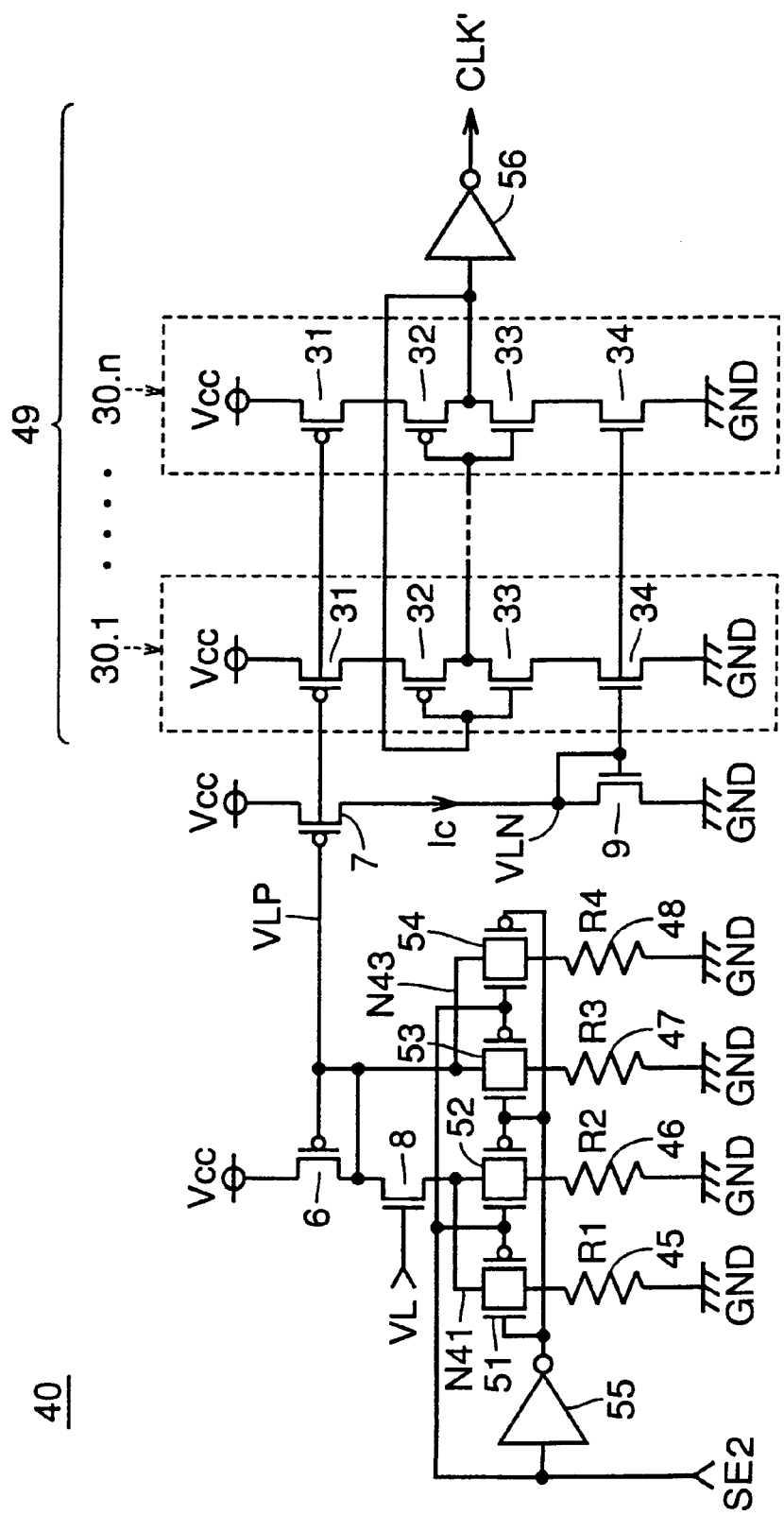
FIG. 4 is a circuit diagram illustrating a structure of a VCO shown in FIG. 3.

A specific structure of VCO 40 is illustrated in FIG. 4. Switches 41–44 are formed of transfer gates 51–54 and an inverter 55. Transfer gates 51 and 52 are connected between node N41 and one electrode of resistance element 45 and one electrode of resistance element 46 respectively. Transfer gates 53 and 54 are connected between node N43 and one electrode of resistance element 47 and one electrode of resistance element 48 respectively. A selection signal SE2 is supplied to the gates of N channel MOS transistors of transfer gates 51 and 53 and the gates of P channel MOS transistors of transfer gates 52 and 54 via inverter 55, and directly to the gates of P channel MOS transistors of transfer gates 51 and 53 and the gates of N channel MOS transistors of transfer gates 52 and 54. When selection signal SE2 is at H level, transfer gates 52 and 54 are conductive and transfer gates 51 and 53 are non-conductive. When selection signal SE2 is at L level, transfer gates 51 and 53 are conductive and transfer gates 52 and 54 are non-conductive.

It is assumed here that resistance values R1 and R3 of resistance elements 45 and 47 are higher than resistance values R2 and R4 of resistance elements 46 and 48, and a frequency range of oscillations that can be produced when transfer gates 51 and 53 are conductive is on the lower frequency side compared with a frequency range of oscillations that can be produced when transfer gates 52 and 54 are conductive.

Current-controlled oscillator 49 includes n stages of current-controlled delay circuits 30.1–30.n connected in a loop form, and an inverter 56. The gates of MOS transistors 31 and 34 of delay circuits 30.1–30.n respectively receive control potentials VLP and VLN. An output clock signal from delay circuit 30.n of the last stage is fed back to delay circuit 30.1 of the first stage and supplied to inverter 56. An output clock signal from inverter 56 is clock signal CLK' from VCO 40. Clock signal CLK' is supplied into the chip and fed back to PFD+CP 1 as a feedback clock signal.

An operation of the PLL circuit is described below. If the frequency of reference clock signal CLK is high, selection signal SE2 has H level to render transfer gates 52 and 54 conductive and render transfer gates 51 and 53 non-conductive. In this case, control current Ic determined by resistance values R2 and R4 of resistance elements 46 and 48 and control voltage VL is relatively large. Current-controlled oscillator 49 produces oscillations at a relatively high frequency according to control current Ic. Clock signal CLK' from current-controlled oscillator 49 is fed back to PFD+CP 1 and accordingly clock signals CLK and CLK' are synchronized.

If reference clock signal CLK has a low frequency, selection signal SE2 is at L level to render transfer gates 51 and 53 conductive and render transfer gates 52 and 54 non-conductive. In this case, control current Ic determined by resistance values R1 and R3 of resistance elements 45 and 47 and control voltage VL is relatively small. Current-controlled oscillator 49 thus produces oscillations at a relatively low frequency according to control current Ic. Clock signal CLK' from current-controlled oscillator 49 is fed back to PFD+CP 1 to synchronize clock signals CLK and CLK' with each other.

According to this embodiment, switching between resistance elements 46 and 48 and resistance elements 45 and 47 of the circuit converting control voltage VL to control current Ic causes a frequency range that can be generated by VCO 40 to switch between two stages of a higher level and a lower level. As a result, compared with the first embodiment including two VCOs 5 and 15, reduction in the layout area and power consumption is achieved.

The resistance value of each pair of resistance elements 45 and 47 and 46 and 48 is individually adjusted, so that the lock range can be changed without changing the gain of the VCO. Accordingly, the PLL circuit having the optimum relation between stability and quick response capability is implemented.

Specifically, the stability and the quick response capability of a PLL circuit system are generally traded off. The stability of the system herein refers to the stability relative to oscillations of the system. Consideration to the oscillation of the system is necessary since negative feedback of an output clock signal to the input side is made. In other words, the higher stability leads to difficulty in oscillation. The quick response capability of the system refers to an ability, when an input signal changes, of how much the system can follow the change of the input signal. In other words, the higher the quick response capability, the superior the adaptability to the change of the signal. The relation of trade-off between the stability and the quick response capability means that if the system has difficulty in producing oscillations, the adaptability to the change of the input signal declines, and if the adaptability to the change of the input signal is enhanced, the system becomes unstable.

The PLL circuit is designed to provide the optimum relation between the stability and the quick response capability depending on the use of the PLL circuit. Factors that determine the stability and quick response capability of the PLL circuit are mainly "VCO gain," "PFD gain," "capacitance and resistance of LPF," and "division ratio." According to this embodiment, "PFD gain," "capacitance and resistance of LPF," and "division ratio" do not change. Regarding "VCO gain," resistance values R1–R4 of resistance elements 45–48 can be adjusted to provide the same VCO gain for a plurality of frequency ranges of oscillations that can be produced. Accordingly, a PLL circuit can be realized with the optimum relation between the stability and the quick response capability while having a plurality of lock ranges.

Although two pairs of resistance elements 45 and 47 and resistance elements 46 and 48 are provided to change the lock range between two levels according to this embodiment, three or more pairs of resistance elements may be provided to change the lock range with at least three levels.

Further, the number of selection signals may be increased to separately select resistance elements 45 and 46 relative to node N41 and resistance elements 47 and 48 relative to node N43.

Third Embodiment

Figure 5:
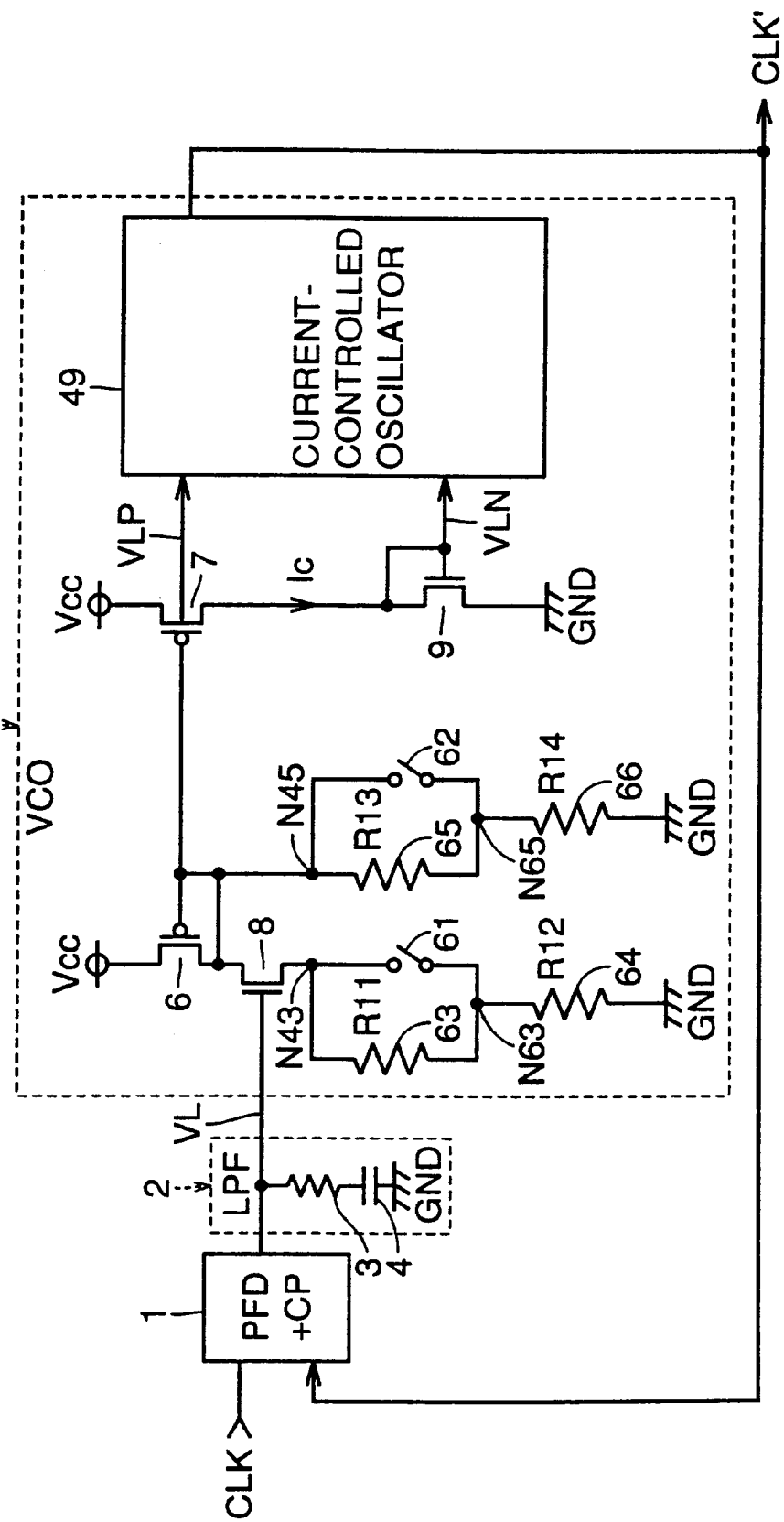
FIG. 5 is a circuit block diagram illustrating a structure of a PLL circuit according to the third embodiment of the present invention.

FIG. 5 is a circuit block diagram illustrating a structure of a PLL circuit according to the third embodiment of the present invention. Referring to FIG. 5, a difference between this PLL circuit and the PLL circuit shown in FIG. 3 is that switches 41–44 and resistance elements 45–48 are replaced with switches 61 and 62 and resistance elements 63–66. Switch 61 and resistance element 63 are connected in parallel between nodes N43 and N63. Resistance element 64 is connected between node N63 and a line of ground potential GND. Switch 62 and resistance element 65 are connected in parallel between nodes N45 and N65, and resistance element 66 is connected between node N65 and the line of ground potential GND.

Figure 6:
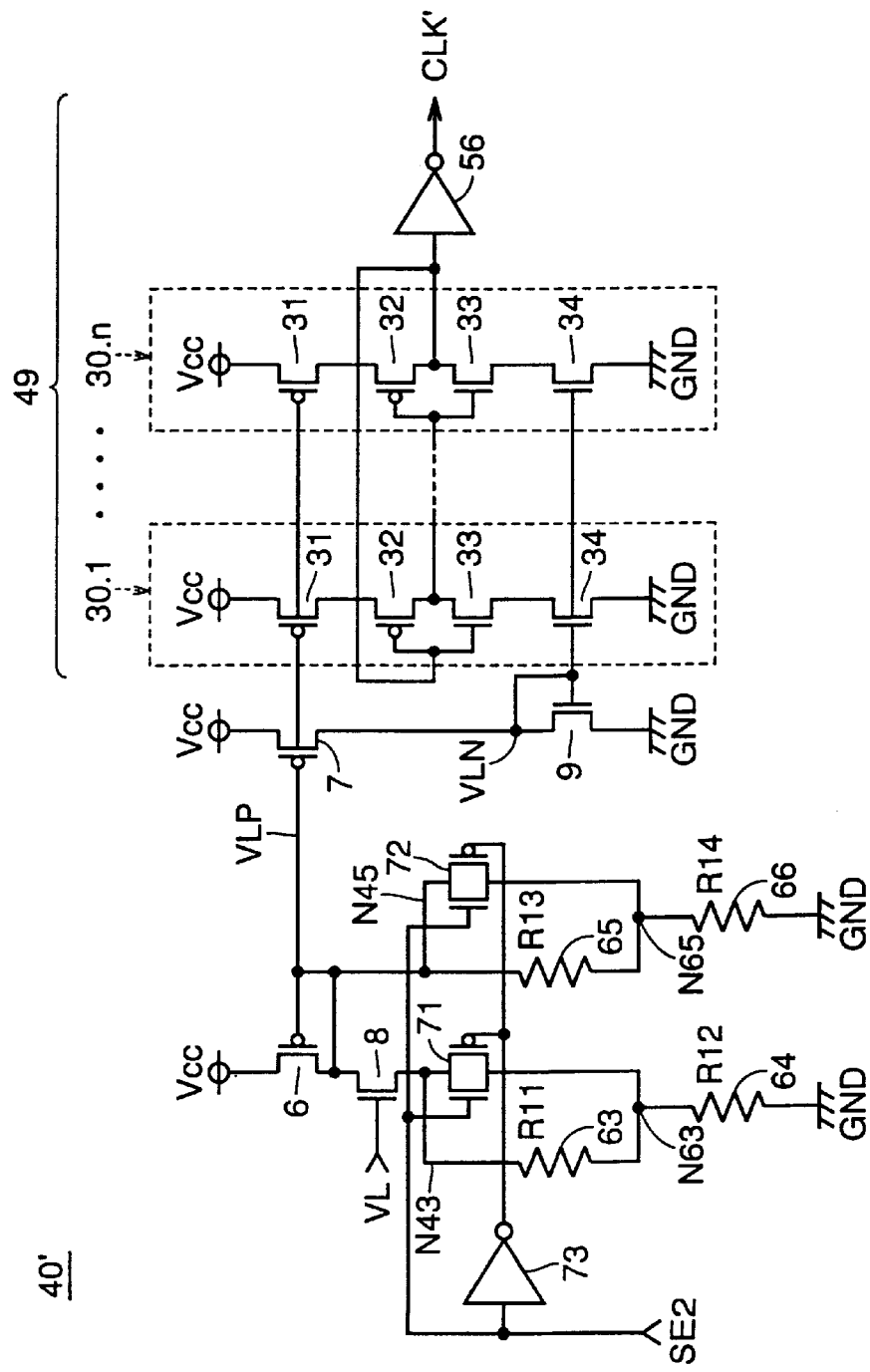
FIG. 6 is a circuit diagram illustrating a structure of a VCO shown in FIG. 5.

A specific structure of a VCO ' is shown in FIG. 6. Switches 61 and 62 are formed of transfer gates 71 and 72 and an inverter 73. A selection signal SE2 is supplied to the gates of P channel MOS transistors of transfer gates 71 and 72 via inverter 73, and directly supplied to the gates of N channel MOS transistors of transfer gates 71 and 72.

When selection signal SE2 is at H level, transfer gates 71 and 72 are conductive, and resistance values between nodes N43 and N45 and the line of ground potential GND are respectively resistance values R12 and R14 of resistance elements 64 and 66. When selection signal SE2 is at L level, transfer gates 71 and 72 are non-conductive, and resistance values between nodes N43 and N45 and the line of ground potential GND are respectively a resistance value R11+R12 and a resistance value R13+R14 of resistance elements 63 and 64 and resistance elements 65 and 66.

Consequently, when selection signal SE2 has H level, the resistance values between nodes N43 and N45 and the line of ground potential GND are relatively small to increase a control current Ic. As a result, the lock range is a relatively higher frequency range. When selection signal SE2 has L level, resistance values between nodes N43 and N45 and the line of ground potential GND are relatively high to reduce control current Ic, and the lock range is a relatively lower frequency range.

Structures and operations except for the above described ones are similar to those of the second embodiment and description thereof is not repeated.

According to this embodiment, the same effect as that of the second embodiment can be obtained. Further, the number of switches can be reduced compared with the second embodiment.

Figure 7:
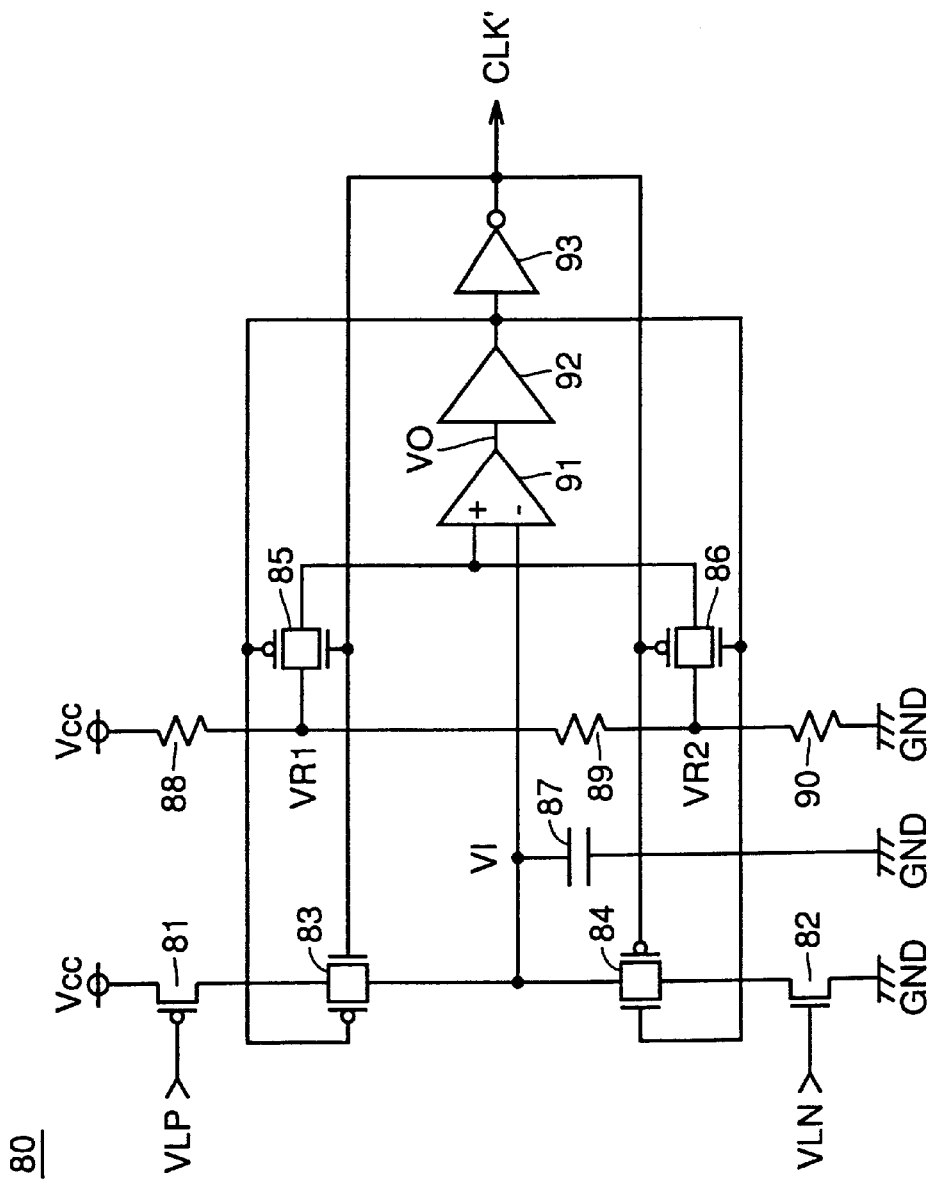
FIG. 7 is a circuit diagram illustrating a modification of the first to the third embodiments.
Figure 8:
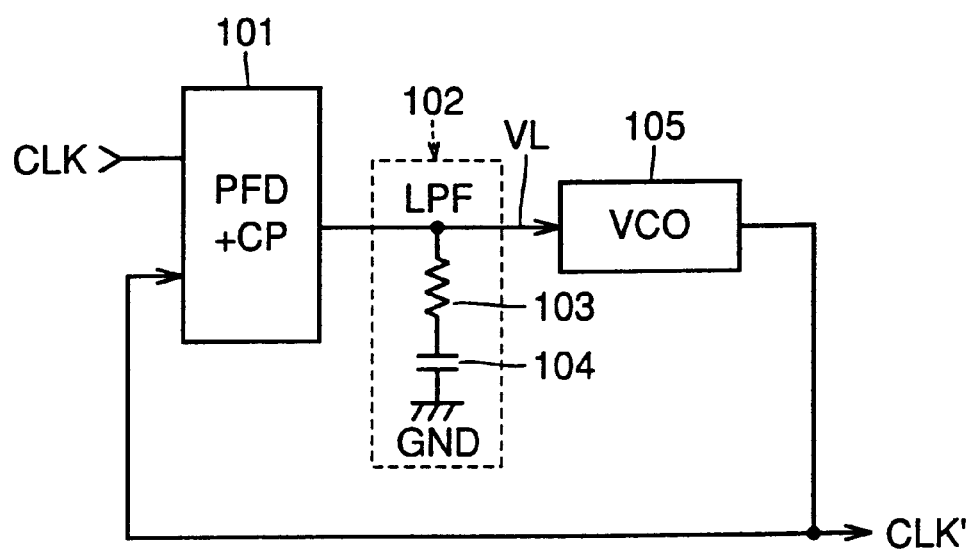
FIG. 8 is a circuit block diagram illustrating a structure of a conventional PLL circuit.
Figure 9:
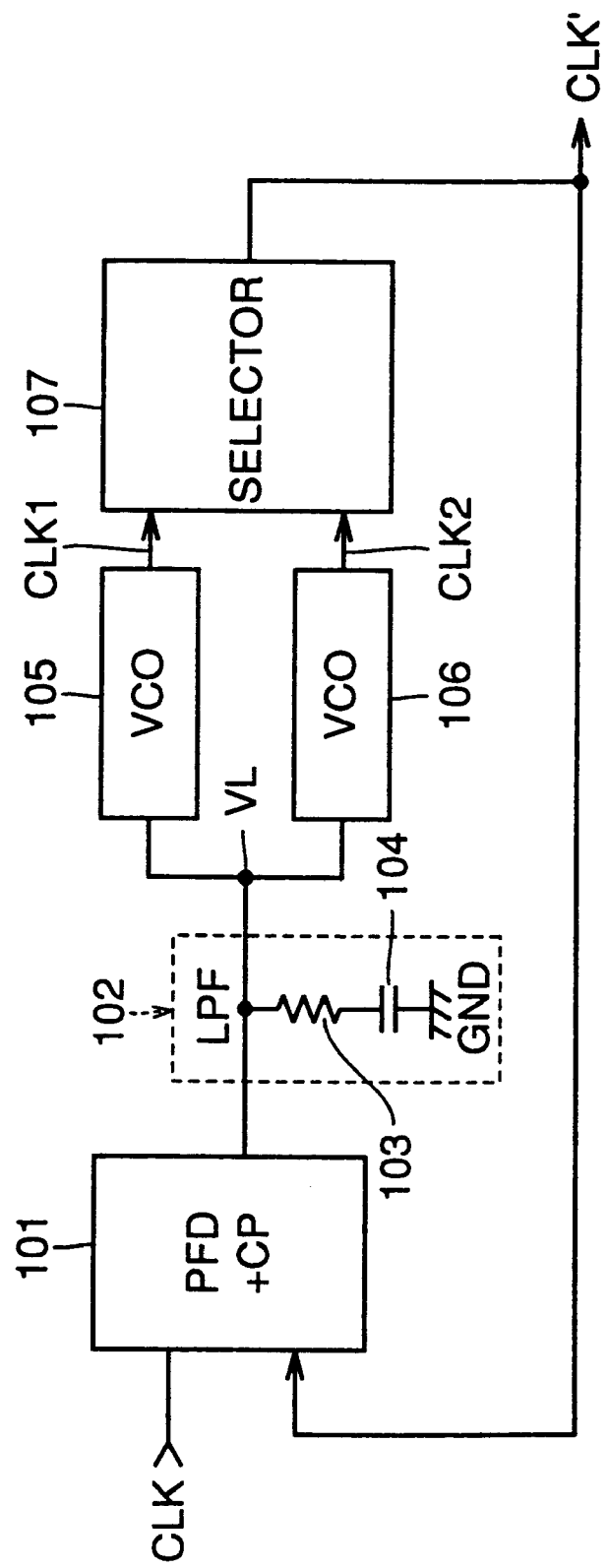
FIG. 9 is a circuit block diagram illustrating a structure of another conventional PLL circuit.

Although current-controlled oscillators 14 and 49 including current-controlled delay circuits 30.1–30.n that are connected in the loop form are employed by the embodiments above, a current-controlled oscillator 80 of the multivibrator type as illustrated in FIG. 7 may employed.

Current-controlled oscillator 80 includes a P channel MOS transistor 81, an N channel MOS transistor 82, transfer gates 83–86, a capacitor 87, resistance elements 88–90, a differential amplifier 91, a Schmidt trigger circuit 92, and an inverter 93. P channel MOS transistor 81 and transfer gate 83 are connected between a line of power supply potential Vcc and an inverse input terminal of differential amplifier 91. N channel MOS transistor 82 and transfer gate 84 are connected between a line of ground potential GND and the inverse input terminal of differential amplifier 91. The gates of MOS transistors 81 and 82 receive control potentials VLP and VLN respectively. Capacitor 87 is connected between the inverse input terminal of differential amplifier 91 and the line of ground potential GND.

Resistance elements 88–90 are connected in series between the line of power supply potential Vcc and the line of ground potential GND. Transfer gate 85 is connected between a node between resistance elements 88 and 89 and an non-inverse input terminal of differential amplifier 91. Transfer gate 86 is connected between a node between resistance elements 89 and 90 and the non-inverse input terminal of differential amplifier 91.

An output voltage VO of differential amplifier 91 is converted by Schmidt trigger circuit 92 to a square wave to be supplied to inverter 93. An output of the Schmidt trigger circuit 92 is supplied to the gates of the P channel MOS transistors of transfer gates 83 and 85 and the gates of N channel MOS transistors of transfer gates 84 and 86. An output signal of inverter 93 is supplied to the gates of N channel MOS transistors of transfer gates 83 and 85 and to the gates of P channel MOS transistors of transfer gates 84 and 86. An output signal of inverter 93 is an output clock signal CLK' of current-controlled oscillator 80.

When clock signal CLK'has H level, transfer gates 83 and 85 are conductive and transfer gates 84 and 86 are non-conductive. Capacitor 87 is thus charged with current flowing through P channel MOS transistor 81 and transfer gate 83. When a terminal voltage VI of capacitor 87 exceeds a voltage VR1 on the node between resistance elements 88 and 89, clock signal CLK' goes to L level.

When clock signal CLK' has L level, transfer gates 84 and 86 are conductive and transfer gates 83 and 85 are non-conductive. Capacitor 87 is thus discharged via transfer gate 84 and N channel MOS transistor 82. When terminal voltage VI of capacitor 87 becomes lower than a voltage VR2 on the node between resistance elements 89 and 90, clock signal CLK' attains H level. Accordingly, the lower the control potential VLP and the higher the control potential VLN, that is, the higher the control current Ic, the larger the charging and discharging current to increase the frequency of clock signal CLK'.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase-locked loop circuit generating a clock signal in synchronization with a reference clock signal, comprising:

a phase difference detecting circuit detecting a difference in phase between said reference clock signal and said clock signal and supplying current according to the difference in phase;

a control voltage generating circuit integrating the current supplied from said phase difference detecting circuit to generate a control voltage;

a plurality of voltage-controlled oscillators respectively having different frequency ranges of oscillations that can be produced and each producing oscillations at a frequency according to said control voltage;

a control circuit activating a voltage-controlled oscillator selected from said plurality of voltage-controlled oscillators and inactivating at least one other voltage-controlled oscillator; and a selecting circuit selecting and outputting oscillations produced by the voltage-controlled oscillator activated by said control circuit, said clock signal being supplied to said phase difference detecting circuit based on the selected oscillations; wherein said voltage-controlled oscillator includes:

a current-controlled oscillator producing oscillations at a frequency according to a control current;

a first transistor allowing current to flow according to said control voltage; and a current mirror circuit supplying current to said voltage-controlled oscillator as said control current according to the current flowing through said first transistor, and wherein said control circuit allows said current mirror circuit to stop its current transmitting function to inactivate said voltage-controlled oscillator and allows said current mirror circuit to perform its current transmitting function to activate said voltage-controlled oscillator.

2. The phase-locked loop circuit according to claim 1, wherein said current mirror circuit includes:

a second transistor having a first electrode connected to a line of a power supply potential, a second electrode connected to a first electrode of said first transistor, and an input electrode connected to said current-controlled oscillator;

a first switching element connected between the input electrode of said second transistor and said line of the power supply potential; and a second switching element connected between the input electrode and the second electrode of said second transistor, and wherein said control circuit renders said first switching element conductive to stop the current transmitting function of said current mirror circuit, and renders said second switching element conductive to allow said current mirror circuit to perform the current transmitting function.

3. A voltage-controlled oscillator producing oscillations at a frequency according to a control voltage comprising:

a current-controlled oscillator producing oscillations at a frequency according to a control current;

a first variable-resistance circuit connected between first and second nodes, and capable of varying a resistance value between the first and second nodes in response to a control signal;

a transistor connected between the second node and a third node to allow current to flow according to said control voltage, said first variable-resistance circuit and said transistor being connected in series between the first node and the third node; and a current mirror circuit for supplying current to said current-controlled oscillator as said control current according to the current flowing through said transistor.

4. A voltage-controlled oscillator producing oscillations at a frequency according to a control voltage in a frequency range selected from a plurality of frequency ranges of oscillations that can be produced, comprising:

a current-controlled oscillator producing oscillations at a frequency according to a control current;

a first variable-resistance circuit having a resistance value adjusted according to said selected frequency range of oscillations that can be produced;

a transistor connected in series with said first variable-resistance circuit to allow current to flow according to said control voltage;

a current mirror circuit for supplying current to said current-controlled oscillator as said control current according to the current flowing through said transistor;

a second variable-resistance circuit connected in parallel with said first variable-resistance circuit and said transistor and having its resistance value adjusted according to said selected frequency range of oscillations that can be produced, wherein said current mirror circuit supplies a sum of current flowing through said transistor and current flowing through said second variable-resistance circuit to said current-controlled oscillator.

5. The voltage-controlled oscillator according to claim 4, wherein said first variable-resistance circuit includes:

a plurality of first resistance elements respectively provided corresponding to said plurality of frequency ranges of oscillations that can be produced and having resistance values according to corresponding frequency ranges of oscillations that can be produced; and a first switching circuit for connecting said transistor in series with one of said plurality of first resistance elements that corresponds to said selected frequency range of oscillations which can be produced, and wherein said second variable-resistance circuit includes:

a plurality of second resistance elements respectively provided corresponding to said plurality of frequency ranges of oscillations and having resistance values according to corresponding frequency ranges; and a second switching circuit for connecting one of said plurality of second resistance elements that corresponds to said selected frequency range of oscillations in parallel with said first resistance element and said transistor that are connected in series by said first switching circuit.

6. The voltage-controlled oscillator according to claim 4, wherein said first variable-resistance circuit includes:

a plurality of first resistance elements connected in series with each other; and a first switching element provided corresponding to at least one of said plurality of first resistance elements and connected in parallel with the corresponding first resistance element, and rendered conductive or non-conductive according to said selected frequency range of oscillations that can be produced, and wherein said second variable-resistance circuit includes:

a plurality of second resistance elements connected in series; and a second switching element provided corresponding to at least one of said plurality of second resistance elements and connected in parallel with the corresponding second resistance element, and rendered conductive or non-conductive according to said selected frequency range of oscillations that can be produced.

7. A phase-locked loop circuit generating a clock signal in synchronization with a reference clock signal, comprising:

a phase difference detecting circuit detecting a difference in phase between said reference clock signal and said clock signal and supplying current according to the difference in phase;

a control voltage generating circuit integrating the current supplied from said phase difference detecting circuit to generate a control voltage; and a voltage-controlled oscillator having a plurality of selectable frequency ranges of oscillations that can be produced, producing oscillations at a frequency according to said control voltage in a frequency range of oscillations selected based on frequency of said reference dock signal, wherein said voltage-controlled oscillator includes:

a current-controlled oscillator producing oscillations at a frequency according to a control current;

a first variable-resistance circuit having its resistance value adjusted according to said selected frequency range of oscillations that can be produced;

a first transistor connected in series with said first variable-resistance circuit and allowing current to flow according to said control voltage; and a current mirror circuit for supplying current to said current-controlled oscillator as said control current according to the current flowing through said first transistor.

8. The phase-locked loop circuit according to claim 7, wherein said voltage-controlled oscillator further includes a second variable-resistance circuit connected in parallel with said first variable-resistance circuit and said first transistor, and having its resistance value adjusted according to said selected frequency range of oscillations that can be produced, and wherein said current mirror circuit supplies a sum of the current flowing through said first transistor and current flowing through said second variable-resistance circuit to said current-controlled oscillator.

9. The voltage-controlled oscillator according to claim 3, wherein said first variable-resistance circuit includes:

a plurality of resistance elements; and a plurality of switches connected in series to said plurality of resistance elements, respectively, each switch being controlled by the control signal.

10. The voltage-controlled oscillator according to claim 9, wherein a plurality of resistance elements includes resistance elements having different resistance value.

11. The voltage-controlled oscillator according to claim 3, wherein said first variable-resistance circuit includes:

first and second resistance elements connected in series, and a switch connected in parallel with said first resistance elements, controlled by the control signal.

12. The voltage-controlled oscillator according to claim 3, further comprising a second variable-resistance circuit connected between the first node and the third node in parallel with said first variable-resistance circuit and said transistor, and capable of varying a resistance value between the first node and the third node in response to the control signal.

13. The voltage-controlled oscillator according to claim 12, wherein each of said first and second variable-resistance circuits includes:

a plurality of resistance elements; and a plurality of switches connected in series to said plurality of resistance elements, respectively, each switch being controlled by the control signal, wherein said voltage-controlled oscillator further comprises:

a control circuit for rendering at least one of said plurality of switches in said first variable-resistance circuit and at least one of said plurality of switches in said second variable-resistance circuit conductive simultaneously in accordance with the control signal.

14. The voltage-controlled oscillator according to claim 12, wherein each of said first and second variable-resistance circuits includes:

first and second resistance elements connected in series, and a switch connected in parallel with said first resistance elements, and controlled by the control signal, wherein said voltage-controlled oscillator further comprises:

a control circuit for rendering said switches in said first and second variable-resistance circuits conductive simultaneously in accordance with the control signal.

15. The voltage-controlled oscillator according to claim 3, wherein said transistor is connected to said current mirror circuit at the third node.

16. A phase-locked loop circuit generating a clock signal in synchronization with a reference clock signal, comprising:

said voltage-controlled oscillator of claim 3;

a phase difference detecting circuit detecting a difference in phase between said reference clock signal and said clock signal and supplying current according to the difference in phase, said clock signal being supplied to said phase difference detecting circuit based on the oscillations produced by said voltage-controlled oscillator; and a controlled voltage generating circuit integrating the current supplied from said phase difference detecting circuit to generate the control voltage to be supplied to said voltage-controlled oscillator.

17. The phase locked-loop circuit of claim 7, wherein said current mirror circuit comprises a second transistor, and said first transistor is connected in series between said second transistor and said first variable-resistance circuit.

* * * * *